(12) United States Patent
Nakatani (10) Patent No.: US 8,151,642 B2
(45) Date of Patent: Apr. 10, 2012

(54) SEMICONDUCTOR DEVICE

(75) Inventor: Goro Nakatani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 795 days.

(21) Appl. No.: 12/289,491

(22) Filed: Oct. 29, 2008

(65) Prior Publication Data

US 2009/0107239 A1    Apr. 30, 2009

(30) Foreign Application Priority Data

Oct. 30, 2007 (JP) ................................. 2007-281969
Sep. 19, 2008 (JP) ................................. 2008-241094

(51) Int. Cl.
*G01P 3/04* (2006.01)

(52) U.S. Cl. .......................................... 73/510; 73/511

(58) Field of Classification Search ............ 73/510–511, 73/514.01
See application file for complete search history.

(56) References Cited

U.S. PATENT DOCUMENTS

| | | | | |
|---|---|---|---|---|
| 5,900,549 A | * | 5/1999 | Moriya | 73/504.12 |
| 5,992,233 A | * | 11/1999 | Clark | 73/514.35 |
| 6,148,671 A | * | 11/2000 | Nakamizo et al. | 73/514.34 |
| 2009/0107239 A1 | * | 4/2009 | Nakatani | 73/514.32 |

FOREIGN PATENT DOCUMENTS

JP    2005-351716    12/2005

* cited by examiner

*Primary Examiner* — Max Noori
(74) *Attorney, Agent, or Firm* — Rabin & Berdo, PC (57) ABSTRACT

A semiconductor device according to the present invention includes a semiconductor substrate and an MEMS sensor provided on the semiconductor substrate. The MEMS sensor includes a first electrode having a plurality of first interdigital portions aligned in a prescribed direction X at an interval, a second electrode, having a plurality of second interdigital portions aligned in the direction X at an interval, so arranged that the second interdigital portions are opposed to the first interdigital portions in the direction X respectively, a third electrode having a plurality of third interdigital portions aligned in a direction Y orthogonal the direction X at an interval, a fourth electrode, having a plurality of fourth interdigital portions aligned in the direction Y at an interval, so arranged that the fourth interdigital portions are opposed to the third interdigital portions in the direction Y respectively, and a fifth electrode opposed to the first electrode, the second electrode, the third electrode and the fourth electrode in a direction Z orthogonal to the direction X and the direction Y.

8 Claims, 11 Drawing Sheets

SEMICONDUCTOR DEVICE

BACKGROUND OF THE INVENTION

1. Field of the Invention

The present invention relates to a semiconductor device including an MEMS (Micro Electro Mechanical Systems) sensor.

2. Description of Related Art

Application of an MEMS sensor to a portable telephone has recently been started, and hence the MEMS sensor attracts much attention. For example, an acceleration sensor for detecting the acceleration of an object is known as a typical MEMS sensor.

Figure 6:
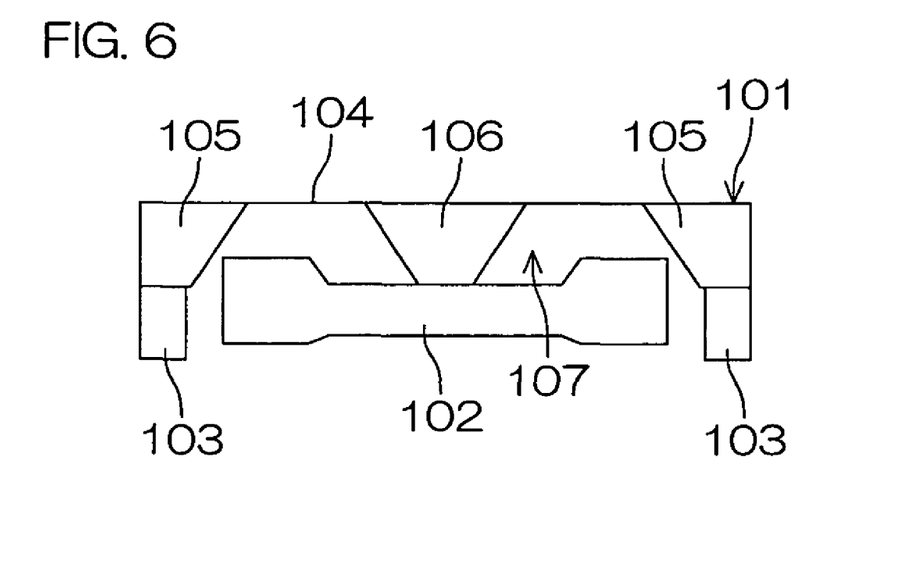
FIG. 6 is a schematic sectional view showing the structure of a conventional acceleration sensor.

FIG. 6 is a schematic sectional view showing the structure of a conventional acceleration sensor.

The acceleration sensor shown in FIG. 6 includes a sensor body 101, a weight 102 held by the sensor body 101 and an annular base 103 supporting the sensor body 101.

The sensor body 101 integrally includes a membrane 104, an annular support portion 105 connected to a peripheral edge portion of a first surface (lower surface) of the membrane 104 and a weight fixing portion 106 connected to a central portion of the first surface of the membrane 104. A plurality of piezoresistors (not shown) are dispersively formed on a second surface (upper surface) of the membrane 104. An annular groove 107 having an isosceles-trapezoidal section narrowed as approaching the membrane 104 isolates the support portion 105 and the weight fixing portion 106 from each other.

The weight 102 is in the form of a disc, for example. This weight 102 is arranged under the weight fixing portion 106, so that a central portion of the upper surface thereof is fixed to the weight fixing portion 106.

The base 103 is in the form of a ring having an inner diameter and an outer diameter generally identical to those of the lower surface of the support portion 105 of the sensor body 101. The support portion 105 is so placed on the base 103 that the base 103 supports the sensor body 101. The weight 102 is provided between the sensor body 101 and a surface on which the base 103 is set in a noncontact state with the base 103 and the support portion 105.

When the weight 102 is shaken in response to acceleration, the membrane 104 so vibrates that stress acts on the piezoresistors provided on the membrane 104. The resistivity of a piezoresistor changes in proportion to stress acting thereon. When a change in the resistivity of each piezoresistor is extracted as a signal, therefore, the acceleration acting on the weight 102 can be obtained on the basis of this signal.

The membrane 104 remarkably vibrates with respect to acceleration in a direction Z orthogonal thereto. Thus, the resistivity of each piezoresistor so remarkably changes that the acceleration in the direction Z can be excellently detected. With respect to acceleration in directions X and Y along the membrane 104, however, the membrane 104 only slightly vibrates to cause only a small change in the resistivity of each piezoresistor, and hence it is difficult to accurately detect the acceleration in the directions X and Y.

SUMMARY OF THE INVENTION

An object of the present invention is to provide a semiconductor device capable of accurately detecting acceleration in directions X, Y and Z orthogonal to one another.

A semiconductor device according to one aspect of the present invention includes a semiconductor substrate and an MEMS sensor provided on the semiconductor substrate. The MEMS sensor includes a first electrode having a plurality of first interdigital portions aligned in a prescribed direction X at an interval, a second electrode, having a plurality of second interdigital portions aligned in the direction X at an interval, so arranged that the second interdigital portions are opposed to the first interdigital portions in the direction X respectively, a third electrode having a plurality of third interdigital portions aligned in a direction Y orthogonal the direction X at an interval, a fourth electrode, having a plurality of fourth interdigital portions aligned in the direction Y at an interval, so arranged that the fourth interdigital portions are opposed to the third interdigital portions in the direction Y respectively, and a fifth electrode opposed to the first electrode, the second electrode, the third electrode and the fourth electrode in a direction Z orthogonal to the direction X and the direction Y.

According to this structure, the MEMS sensor including the first electrode, the second electrode, the third electrode, the fourth electrode and the fifth electrode is provided on the semiconductor substrate. The first electrode and the second electrode have the plurality of first interdigital portions and the plurality of second interdigital portions aligned in the direction X at intervals respectively, and are so arranged that the first interdigital portions and the second interdigital portions are opposed to one another in the direction X respectively. Thus, each first interdigital portion and the second interdigital portion opposed thereto in the direction X form a capacitor (hereinafter referred to as "X-directional capacitor" in this paragraph) whose capacitance varies with the interval between these interdigital portions. When acceleration in the direction X is caused in the semiconductor device, each first interdigital portion (first electrode) and/or each second interdigital portion (second electrode) vibrates in the direction X, to change the interval between each first interdigital portion and the second interdigital portion opposed thereto in the direction X. Consequently, the capacitance of each X-directional capacitor changes. Each first interdigital portion and each second interdigital portion are opposed to each other in the direction X, whereby the interval between the first and second interdigital portions remarkably changes to remarkably change the capacitance of each X-directional capacitor regardless of the magnitude of the acceleration in the direction X caused in the semiconductor device. Even if the change in the capacitance of each X-directional capacitor is small, the sum of the changes in the capacitances of the X-directional capacitors increases. Therefore, the magnitude of the acceleration in the direction X can be accurately detected on the basis of the changes in the capacitances of the X-directional combined capacitors or the sum thereof.

The third electrode and the fourth electrode have the plurality of third interdigital portions and the plurality of fourth interdigital portions aligned in the direction Y at intervals respectively, and are so arranged that the third interdigital portions and the fourth interdigital portions are opposed to one another in the direction Y respectively. Thus, each third interdigital portion and the fourth interdigital portion opposed thereto in the direction Y form a capacitor (hereinafter referred to as "Y-directional capacitor" in this paragraph) whose capacitance varies with the interval between these interdigital portions. When acceleration in the direction Y is caused in the semiconductor device, each third interdigital portion (third electrode) and/or each fourth interdigital portion (fourth electrode) vibrates in the direction X, to change the interval between each third interdigital portion and the fourth interdigital portion opposed thereto in the direction Y. Consequently, the capacitance of each Y-directional capacitor changes. Each third interdigital portion and each fourth interdigital portion are opposed to each other in the direction Y, whereby the interval between the third and fourth interdigital portions remarkably changes to remarkably change the capacitance of each Y-directional capacitor regardless of the magnitude of the acceleration in the direction Y caused in the semiconductor device. Even if the change in the capacitance of each Y-directional capacitor is small, the sum of the changes in the capacitances of the Y-directional capacitors increases. Therefore, the magnitude of the acceleration in the direction Y can be accurately detected on the basis of the changes in the capacitances of the Y-directional capacitors or the sum thereof.

The fifth electrode is opposed to the first electrode, the second electrode, the third electrode and the fourth electrode in the direction Z orthogonal to the direction X and the direction Y. Each of vibratory ones (hereinafter referred to as "vibratory electrode" in this paragraph) of the first to fourth electrodes and the fifth electrode form a capacitor (hereinafter referred to as "Z-directional capacitor" in this paragraph) whose capacitance varies with the interval between these electrodes. When acceleration in the direction Z is caused in the semiconductor device, each vibratory electrode vibrates in the direction Z, to change the interval between each vibratory electrode and the fifth electrode. Consequently, the capacitance of each Z-directional capacitor changes. Each vibratory electrode is opposed to the fifth electrode in the direction Z, whereby the interval between each vibratory electrode and the fifth electrode remarkably changes to remarkably change the capacitance of each Z-directional capacitor regardless of the magnitude of the acceleration in the direction Z caused in the semiconductor device. Even if the change in the capacitance of each Z-directional capacitor is small, the sum of the changes in the capacitances of the Z-directional capacitors increases. Therefore, the magnitude of the acceleration in the direction Z can be accurately detected on the basis of the changes in the capacitances of the Z-directional capacitors or the sum thereof.

The vibratory electrodes vibrate not only when the acceleration in the direction Z is caused in the semiconductor device but also when pressure (sound pressure, for example) is externally input therein, whereby the magnitude of the pressure input in the vibratory electrodes can also be detected on the basis of the sum of the changes in the capacitances of the Z-directional capacitors. Therefore, the MEMS sensor, employable as a triaxial acceleration sensor, can also be employed as a pressure sensor.

The semiconductor device may include an X-directional acceleration detector for detecting X-directional acceleration acting on the MEMS sensor on the basis of a change in the capacitance of a capacitor formed by the first electrode and the second electrode.

When the semiconductor device includes the X-directional acceleration detector, no semiconductor chip having such an X-directional acceleration detector may be provided separately from the semiconductor device, whereby the structure of an apparatus loaded with the semiconductor device can be simplified.

The semiconductor device may include a Y-directional acceleration detector for detecting Y-directional acceleration acting on the MEMS sensor on the basis of a change in the capacitance of a capacitor formed by the third electrode and the fourth electrode.

When the semiconductor device includes the Y-directional acceleration detector, no semiconductor chip having such a Y-directional acceleration detector may be provided separately from the semiconductor device, whereby the structure of the apparatus loaded with the semiconductor device can be simplified.

Further, the semiconductor device may include a Z-directional acceleration detector for detecting Z-directional acceleration acting on the MEMS sensor on the basis of a change in the capacitance of a capacitor formed by at least one of the first electrode, the second electrode, the third electrode and the fourth electrode and the fifth electrode.

When the semiconductor device includes the Z-directional acceleration detector, no semiconductor chip having such a Z-directional acceleration detector may be provided separately from the semiconductor device, whereby the structure of the apparatus loaded with the semiconductor device can be simplified.

The first electrode and the second electrode may constitute an X-directional pair for detecting X-directional acceleration, the third electrode and the fourth electrode may constitute a Y-directional pair for detecting Y-directional acceleration, and the MEMS may include a plurality of X-directional pairs and a plurality of Y-directional pairs.

In this case, the X-directional pairs and the Y-directional pairs may be so arranged that the X-directional pairs are aligned in the direction X, the Y-directional pairs are aligned in the direction X, and the X-directional pairs and the Y-directional pairs are aligned in the direction Y.

Alternatively, the X-directional pairs and the Y-directional pairs may be so arranged that the X-directional pairs are not aligned in the direction X and the Y-directional pairs are not aligned in the direction X either, but the X-directional pairs and the Y-directional pairs are aligned in the direction Y.

The foregoing and other objects, features and effects of the present invention will become more apparent from the following detailed description of the embodiments with reference to the attached drawings.

DETAILED DESCRIPTION OF PREFERRED EMBODIMENTS

An embodiment of the present invention is now described in detail with reference to the attached drawings.

Figure 1:
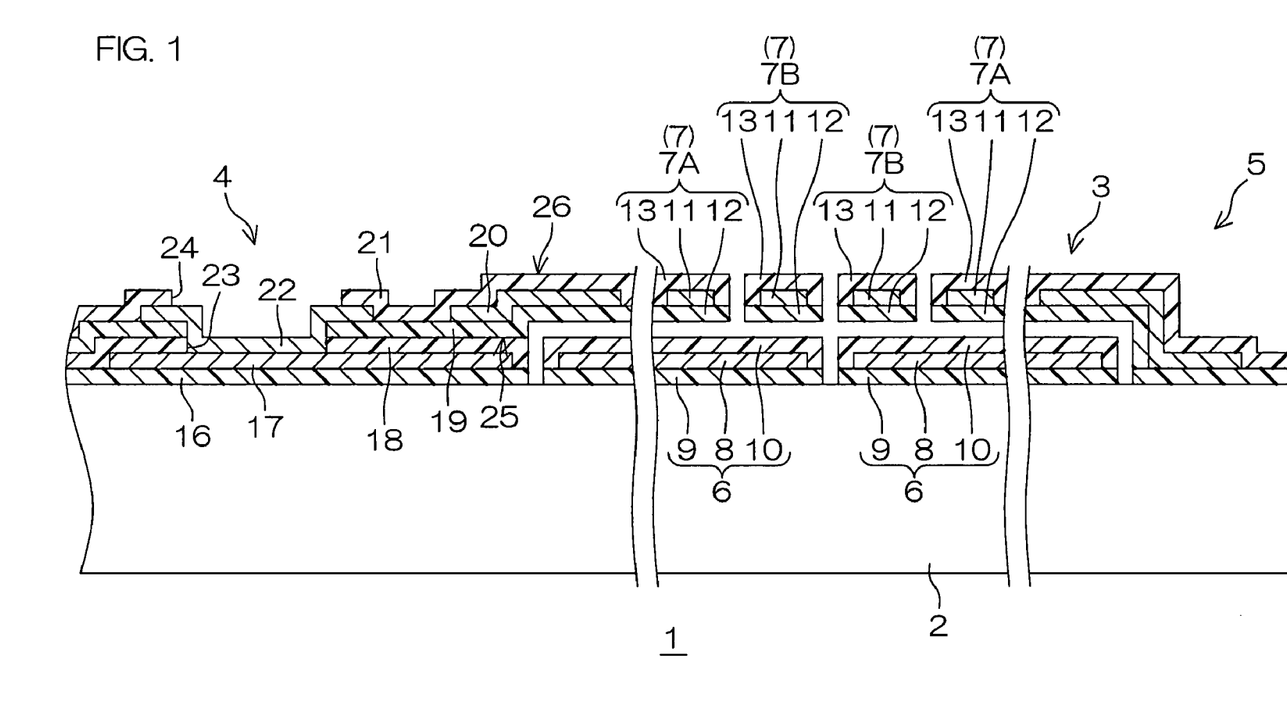
FIG. 1 is a sectional view showing the structure of a semiconductor device according to an embodiment of the present invention.

FIG. 1 is a sectional view showing the structure of a semiconductor device 1 according to an embodiment of the present invention.

The semiconductor device 1 includes a semiconductor substrate (silicon substrate, for example) 2. An MEMS sensor 5 having a sensor portion 3 and a pad portion 4 is provided on the semiconductor substrate 2.

The sensor portion 3 includes four lower thin films 6 provided in contact with the surface of the semiconductor substrate 2 and four vibrator pairs 7 opposed to the lower thin films 6 at a prescribed interval respectively.

The four lower thin films 6 are in the form of sectors in plan view respectively, and so arranged that arcuate peripheral edges thereof are located on the same circumference, for example.

Each lower thin film 6 is formed by covering a lower electrode 8 with a first lower insulating film 9 and a second lower insulating film 10. More specifically, the first lower insulating film 9 is made of SiN (silicon nitride), and formed on the surface of the semiconductor substrate 2. The lower electrode 8 in the form of a thin film made of Al (aluminum) is formed on the lower insulating film 9. The second lower insulating film 10 is made of SiN, and formed on the lower electrode 8 and the first lower insulating film 9. Thus, the lower surface of the lower electrode 8 is covered with the first lower insulating film 9, while the upper surface and the side surfaces of the lower electrode 8 are covered with the second lower insulating film 10.

Each vibrator pair 7 includes two vibrators 7A and 7B. Each of the vibrators 7A and 7B is formed by covering an upper electrode 11 with a first upper insulating film 12 and a second upper insulating film 13. More specifically, the first upper insulating film 12 is made of SiN, and formed above the corresponding lower thin film 6 at an interval therefrom. The upper electrode 11 made of Al is formed on the first upper insulating film 12. The second upper insulating film 13 is made of SiN, and formed on the upper electrode 11 and the first upper insulating film 12. Thus, the lower surface of the upper electrode 11 is covered with the first upper insulating film 12, while the upper surface and the side surfaces of the upper electrode 11 are covered with the second upper insulating film 13.

The pad portion 4 includes a first insulating layer 16, first wires 17, a second insulating layer 18, a third insulating layer 19, a second wire 20, a fourth insulating layer 21 and a pad 22.

The first insulating layer 16 is made of SiN. The first insulating layer 16 is formed on the surface of the semiconductor substrate 2 on the periphery of the sensor portion 3 (four lower thin films 6). The first insulating layer 16 has a connecting portion (not shown) connected to the first lower insulating film 9 of each lower thin film 6, and is integrated with the first lower insulating film 9 of each lower thin film 6.

The first wires 17 are made of Al. Four first wires 17 are provided in association with the lower electrodes 8 of the lower thin films 6 respectively. Each first wire 17 is formed on the first insulating layer 16 to extend on each connecting portion of the first insulating layer 16, and connected to the lower electrode 8 corresponding thereto.

The second insulating layer 18 is made of SiN. The second insulating layer 18 is formed on the first insulating layer 16, to cover the upper surfaces and the side surfaces of the first wires 17. The second insulating layer 18 is connected to the second lower insulating film 10 of each lower thin film 6 on a portion covering each first wire 17 along with each connecting portion of the first insulating layer 16, to be integrated with the second lower insulating film 10 of each lower thin film 6.

The third insulating layer 19 is made of SiN. The third insulating layer 19 is formed on the second insulating layer 18. The third insulating layer 19 has a connecting portion 25 connected to the first upper insulating film 12 of each of the vibrators 7A and 7B, and is integrated with the first upper insulating film 12 of each of the vibrators 7A and 7B.

The second wire 20 is made of Al. The second wire 20 is formed on the third insulating layer 19 to extend on each connecting portion 25 of the third insulating layer 19, and electrically connected with a second X-directional electrode 28 (described later) or a second Y-directional electrode 30 (described later) provided on each vibrator 7A, for example.

The fourth insulating layer 21 is made of SiN. The fourth insulating layer 21 is formed on the third insulating layer 19, to cover the upper surface and the side surfaces of the second wire 20. A portion 26 of the fourth insulating layer 21 covering the second wire 20 along with each connecting portion 25 of the third insulating layer 16 is continuous to the upper insulating film 13 of each of the vibrators 7A and 7B. Thus, the fourth insulating layer 21 is integrated with the second upper insulating film 13.

Each of the vibrators 7A and 7B is cantilever-supported in a vibratory manner by the connecting portion 25 of the third insulating layer 19 and the portion 26 of the fourth insulating layer 21 covering the second wire 20, with a cavity between the same and the lower thin film 6. Therefore, each of the vibrators 7A and 7B vibrates by small acceleration or pressure.

The four pads 22 are made of Al. Four openings 23 (FIG. 1 illustrates only one opening 23) for partially exposing the first wires 17 respectively are formed in the second and third insulating layers 18 and 19, to continuously pass through these layers 18 and 19 in the thickness direction. Each pad 22 covers the corresponding first wire 17 in each opening 23, while a peripheral edge portion thereof extends onto the third insulating layer 19. Four openings 24 for exposing the pads 22 respectively are formed in the fourth insulating layer 21. A peripheral edge portion of each pad 22 is covered with a portion of the fourth insulating layer 21 located around each opening 24. A wire for extracting a current flowing in each first wire 17 is connected to each pad 22.

Figure 2:
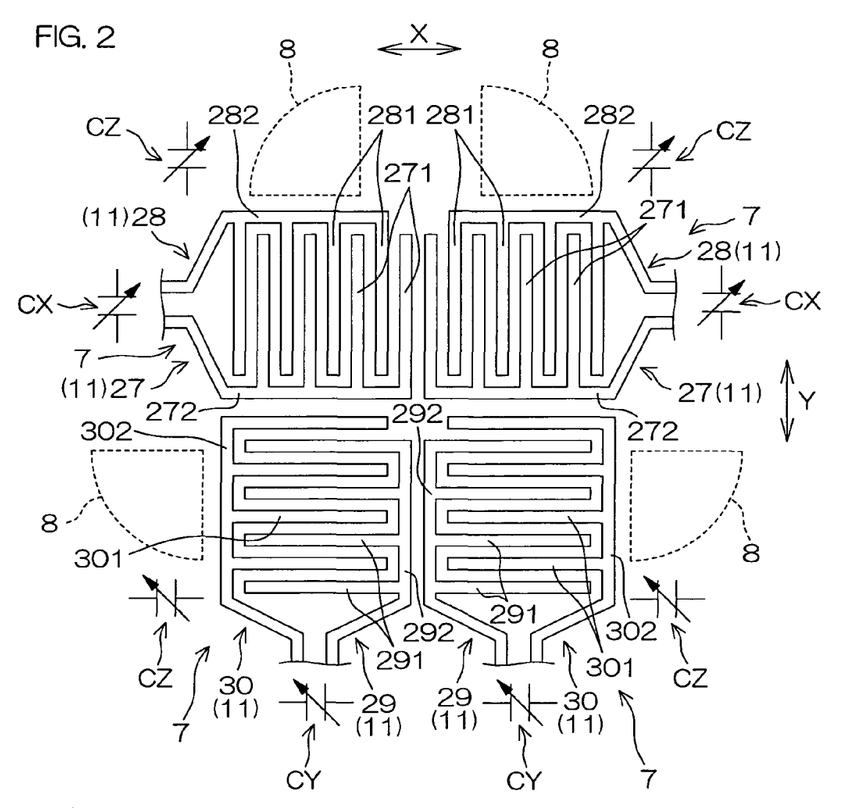
FIG. 2 is a schematic plan view for illustrating the structure of upper electrodes shown in FIG. 1 and capacitors provided on an MEMS sensor.

FIG. 2 is a schematic plan view of the upper electrodes 11 shown in FIG. 1.

The four vibrator pairs 7 are arranged in the form of a matrix with two rows and two columns, assuming that a prescribed direction X parallel to the surfaces of the lower thin films 6 (see FIG. 1) is the row direction and a direction Y parallel to the surfaces of the lower thin films 6 and orthogonal to the direction X is the column direction. Thus, two sets of two vibrator pairs 7 are aligned in the direction X. Two vibrator pairs 7 forming one of the two sets are X-directional pairs for detecting acceleration in the direction X. The first vibrators 7A (see FIG. 1) of the X-directional pairs 7 include first X-directional electrodes 27 as the upper electrodes 11. The second vibrators 7B (see FIG. 1) of the X-directional pairs 7 include second X-directional electrodes 28 as the upper electrodes 11.

Each first X-directional electrode 27 integrally includes a plurality of interdigital portions 271 aligned in the direction X at an interval and a coupling portion 272 coupling first ends of the interdigital portions 271 with one another.

Each second X-directional electrode 28 integrally includes a plurality of interdigital portions 281 aligned in the direction X at an interval and a coupling portion 282 coupling first ends of the interdigital portions 281 with one another. The second wire 20 (see FIG. 1) is connected to the coupling portion 282. The second X-directional electrode 28 is so arranged that each interdigital portion 281 is opposed to each interdigital portion 271 of the first X-directional electrode 27 in the direction X, i.e., so that each interdigital portion 281 meshes with each interdigital portion 271.

Thus, each interdigital portion 271 and the interdigital portion 281 opposed thereto in the direction X form a capacitor (hereinafter referred to as "X-directional capacitor" in this paragraph) whose capacitance varies with the interval between the electrodes 27 and 28. Such X-directional capacitors parallelly connected with one another are equivalent to a capacitor (hereinafter referred to as "X-directional combined capacitor" in this paragraph) CX formed by the first X-directional electrode 27 and the second X-directional electrode 28. When acceleration in the direction X is caused in the semiconductor device 1, each interdigital portion 271 and each interdigital portion 281 vibrate in the direction X, to change the interval between each interdigital portion 271 and the interdigital portion 281 opposed thereto in the direction X. Consequently, the capacitance of each X-directional capacitor changes. Each interdigital portion 271 and each interdigital portion 281 are opposed to each other in the direction X, whereby the interval between the interdigital portions 271 and 281 remarkably changes to remarkably change the capacitance of each X-directional capacitor regardless of the magnitude of the acceleration in the direction X caused in the semiconductor device 1. Even if the change in the capacitance of each X-directional capacitor is small, the change in the capacitance of the X-directional combined capacitor CX (the sum of the changes in the capacitances of the X-directional capacitors) increases. Therefore, the magnitude of the acceleration in the direction X can be accurately detected on the basis of the change in the capacitance of the X-directional combined capacitor CX.

The two vibrator pairs 7 forming the set different from that of the X-directional pairs 7 are Y-directional pairs for detecting acceleration in the direction Y. The first vibrators 7A (see FIG. 1) of the Y-directional pairs 7 include first Y-directional electrodes 29 as the upper electrodes 11. The second vibrators 7B (see FIG. 1) of the Y-directional pairs 7 include second Y-directional electrodes 30 as the upper electrodes 11.

Each first Y-directional electrode 29 integrally includes a plurality of interdigital portions 291 aligned in the direction Y at an interval and a coupling portion 292 coupling first ends of the interdigital portions 291 with one another.

Each second Y-directional electrode 30 integrally includes a plurality of interdigital portions 301 aligned in the direction X at an interval and a coupling portion 302 coupling first ends of the interdigital portions 301 with one another. The second wire 20 (see FIG. 1) is connected to the coupling portion 302. The second Y-directional electrode 30 is so arranged that each interdigital portion 301 is opposed to each interdigital portion 291 of the first Y-directional electrode 29 in the direction Y, i.e., so that each interdigital portion 301 meshes with each interdigital portion 291.

Thus, each interdigital portion 291 and the interdigital portion 301 opposed thereto in the direction Y form a capacitor (hereinafter referred to as "Y-directional capacitor" in this paragraph) whose capacitance varies with the interval between the electrodes 29 and 30. Such Y-directional capacitors parallelly connected with one another are equivalent to a capacitor (hereinafter referred to as "Y-directional combined capacitor" in this paragraph) CY formed by the first Y-directional electrode 29 and the second Y-directional electrode 30. When acceleration in the direction Y is caused in the semiconductor device 1, each interdigital portion 291 and each interdigital portion 301 vibrate in the direction Y, to change the interval between each interdigital portion 291 and the interdigital portion 301 opposed thereto in the direction Y. Consequently, the capacitance of each Y-directional capacitor changes. Each interdigital portion 291 and each interdigital portion 301 are opposed to each other in the direction Y, whereby the interval between the interdigital portions 291 and 301 remarkably changes to remarkably change the capacitance of each Y-directional capacitor regardless of the magnitude of the acceleration in the direction Y caused in the semiconductor device 1. Even if the change in the capacitance of each Y-directional capacitor is small, the change in the capacitance of the Y-directional combined capacitor CY (the sum of the changes in the capacitances of the Y-directional capacitors) increases. Therefore, the magnitude of the acceleration in the direction Y can be accurately detected on the basis of the change in the capacitance of the Y-directional combined capacitor CY.

A prescribed voltage (11 V, for example) is applied to each second X-directional electrode 28 and each second Y-directional electrode 30 through the second wire 20 (see FIG. 1). Each second X-directional electrode 28 and each second Y-directional electrode 30 and the lower electrode 8 opposed thereto form capacitors (hereinafter referred to as "Z-directional capacitors" in this paragraph) CZ whose capacitances vary with the intervals between the electrodes 28 and 30 and the lower electrode 8. When acceleration in the direction Z is caused in the semiconductor device 1, each second X-directional electrode 28 and each second Y-directional electrode 30 vibrate in the direction Z, to change the intervals between each second X-directional electrode 28 and each second Y-directional electrode 30 and the lower electrode 8 opposed thereto. Consequently, the capacitances of the Z-directional capacitors CZ change. Each second X-directional electrode 28 and each second Y-directional electrode 30 are opposed to the lower electrode 8 in the direction Z, whereby the intervals between each second X-directional electrode 28 and each second Y-directional electrode 30 and the lower electrode 8 remarkably change to remarkably change the capacitances of the Z-directional capacitors CZ regardless of the magnitude of the acceleration in the direction Z caused in the semiconductor device 1. Even if the changes in the capacitances of the Z-directional capacitors CZ are small, the sum of the changes in the capacitances of the Z-directional capacitors CZ increases. Therefore, the magnitude of the acceleration in the direction Z can be accurately detected on the basis of the changes in the capacitances of the Z-directional capacitors CZ or the sum thereof.

Each second X-directional electrode 28 and each second Y-directional electrode 30 vibrate not only when the acceleration in the direction Z is caused in the semiconductor device 1 but also when pressure (sound pressure, for example) is externally input therein, whereby the magnitude of the pressure input in each second X-directional electrode 28 and each second Y-directional electrode 30 can also be detected on the basis of the sum of the changes in the capacitances of the Z-directional capacitors CZ. Therefore, the MEMS sensor 5, employable as a triaxial acceleration sensor, can also be employed as a pressure sensor.

Figure 3:
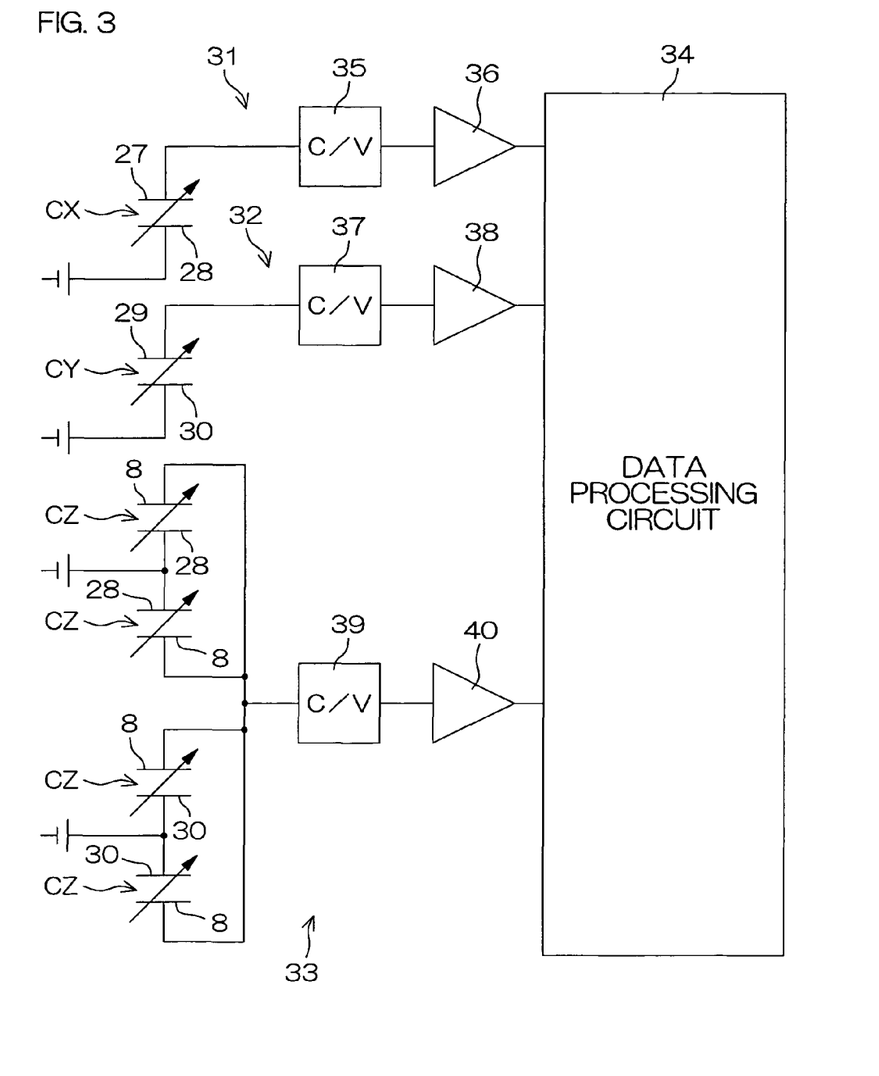
FIG. 3 is a diagram showing a circuit structure for detecting acceleration and pressure with the MEMS sensor.

FIG. 3 is a diagram showing a circuit structure for detecting acceleration and pressure.

The semiconductor device 1 includes an X-directional acceleration detector 31 for detecting the acceleration in the direction X, a Y-directional acceleration detector 32 for detecting the acceleration in the direction Y, a Z-directional acceleration/pressure detector 33 for detecting the acceleration in the direction Z and the externally input pressure, and a data processing circuit 34 processing signals received from the X-directional acceleration detector 31, the Y-directional acceleration detector 32 and the Z-directional acceleration/pressure detector 33 respectively and outputting signals indicating the acceleration in the direction X, the acceleration in the direction Y, and the acceleration in the direction Z and the value of the pressure.

The X-directional acceleration detector 31, the Y-directional acceleration detector 32, the Z-directional acceleration/pressure detector 33 and the data processing circuit 34 are constituted of elements built into the semiconductor substrate 2 and wires formed on the semiconductor substrate 2, and integrated into a chip along with the MEMS sensor 5.

The X-directional acceleration detector 31 includes a C/V conversion circuit 35 and a gain amplifier 36. The first X-directional electrode 27 constituting the X-directional combined capacitor CX is connected to the input end of the C/V conversion circuit 35. The output end of the C/V conversion circuit 35 is connected to the input end of the gain amplifier 36. The output end of the gain amplifier 36 is connected to the data processing circuit 34.

The Y-directional acceleration detector 32 includes a C/V conversion circuit 37 and a gain amplifier 38. The first Y-directional electrode 29 constituting the Y-directional combined capacitor CY is connected to the input end of the C/V conversion circuit 37. The output end of the C/V conversion circuit 37 is connected to the input end of the gain amplifier 38. The output end of the gain amplifier 38 is connected to the data processing circuit 34.

The Z-directional acceleration/pressure detector 33 includes a C/V conversion circuit 39 and a gain amplifier 40. The lower electrodes 28 constituting four Z-directional capacitors CZ are connected to the input end of the C/V conversion circuit 39. The output end of the C/V conversion circuit 39 is connected to the input end of the gain amplifier 40. The output end of the gain amplifier 40 is connected to the data processing circuit 34.

When the acceleration in the direction X is caused in the semiconductor device 1 and the first and second X-directional electrodes 27 and 28 vibrate due to the acceleration in the direction X, the capacitance of the X-directional combined capacitor CX changes. Following this change in the capacitance of the X-directional combined capacitor CX, a current responsive to this change is acting on the C/V conversion circuit 35. The C/V conversion circuit 35 forms a voltage signal responsive to the input current. The voltage signal formed in the C/V conversion circuit 35 is acting on the gain amplifier 36. The gain amplifier 36 forms an amplification signal by multiplying the voltage signal formed in the C/V conversion circuit 35 by a proper gain. The amplification signal formed in this manner corresponds to the change in the capacitance of the X-directional combined capacitor CX resulting from the acceleration in the direction X. Therefore, the data processing circuit 34 can obtain the acceleration in the direction X on the basis of the amplification signal received from the gain amplifier 36.

When the acceleration in the direction Y is caused in the semiconductor device 1 and the first and second Y-directional electrodes 29 and 30 vibrate due to the acceleration in the direction Y, the capacitance of the Y-directional combined capacitor CY changes. Following this change in the capacitance of the Y-directional combined capacitor CY, a current responsive to this change is acting on the C/V conversion circuit 37. The C/V conversion circuit 37 forms a voltage signal responsive to the input current. The voltage signal formed in the C/V conversion circuit 37 is acting on the gain amplifier 38. The gain amplifier 38 forms an amplification signal by multiplying the voltage signal formed in the C/V conversion circuit 37 by a proper gain. The amplification signal formed in this manner corresponds to the change in the capacitance of the Y-directional combined capacitor CY resulting from the acceleration in the direction Y. Therefore, the data processing circuit 34 can obtain the acceleration in the direction Y on the basis of the amplification signal received from the gain amplifier 38.

When the acceleration in the direction Z is caused in the semiconductor device 1 or pressure is externally input and each second X-directional electrode 28 and each second Y-directional electrode 30 vibrate, the capacitances of the four Z-directional capacitors CZ change respectively. Following this, currents responsive to the changes in the capacitances are jointly acting on the C/V conversion circuit 39 from the Z-directional capacitors CZ. The C/V conversion circuit 39 forms a voltage signal responsive to the input currents. The voltage signal formed in the C/V conversion circuit 39 is acting on the gain amplifier 40. The gain amplifier 40 forms an amplification signal by multiplying the voltage signal formed in the C/V conversion circuit 39 by a proper gain. The amplification signal formed in this manner corresponds to the sum of the changes in the capacitances of the respective Z-directional capacitors CZ resulting from the acceleration in the direction Z. Therefore, the data processing circuit 34 can obtain the acceleration in the direction Z or the externally input pressure on the basis of the amplification signal received from the gain amplifier 40.

The semiconductor device 1 includes the X-directional acceleration detector 31, the Y-directional acceleration detector 32, the Z-directional acceleration/pressure detector 33 and the data processing circuit 34 and no semiconductor chip having such circuits may be provided separately from the semiconductor device 1, whereby the structure of an apparatus loaded with the semiconductor device 1 can be simplified.

FIGS. 4A to 4F are schematic sectional views successively showing the steps of manufacturing the semiconductor device 1 (MEMS sensor 5) shown in FIG. 1.

Figure 4A:
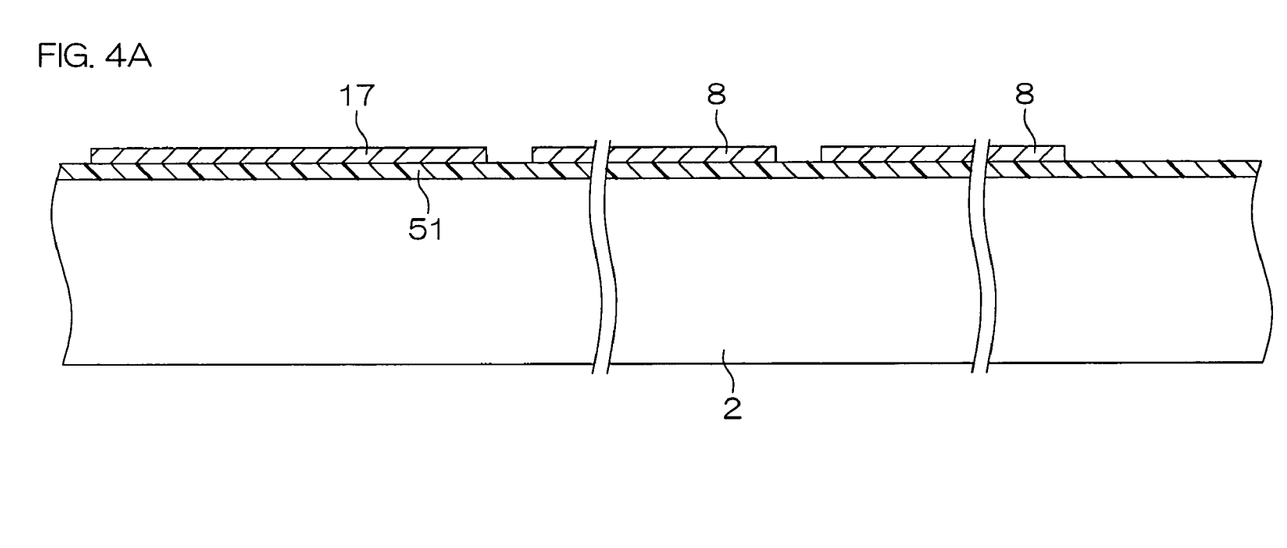
FIG. 4A is a schematic sectional view for illustrating a method of manufacturing the semiconductor device (MEMS sensor) shown in FIG. 1.

First, a first SiN layer 51 is formed on the surface of the semiconductor substrate 2 by P-CVD (Plasma Chemical Vapor Deposition), as shown in FIG. 4A. Thereafter an Al film is formed on the first SiN layer 51 by sputtering. Then, the Al film is patterned by photolithography and etching. Thus, the lower electrodes 8 and each first wire 17 are formed on the first SiN layer 51.

Figure 4B:
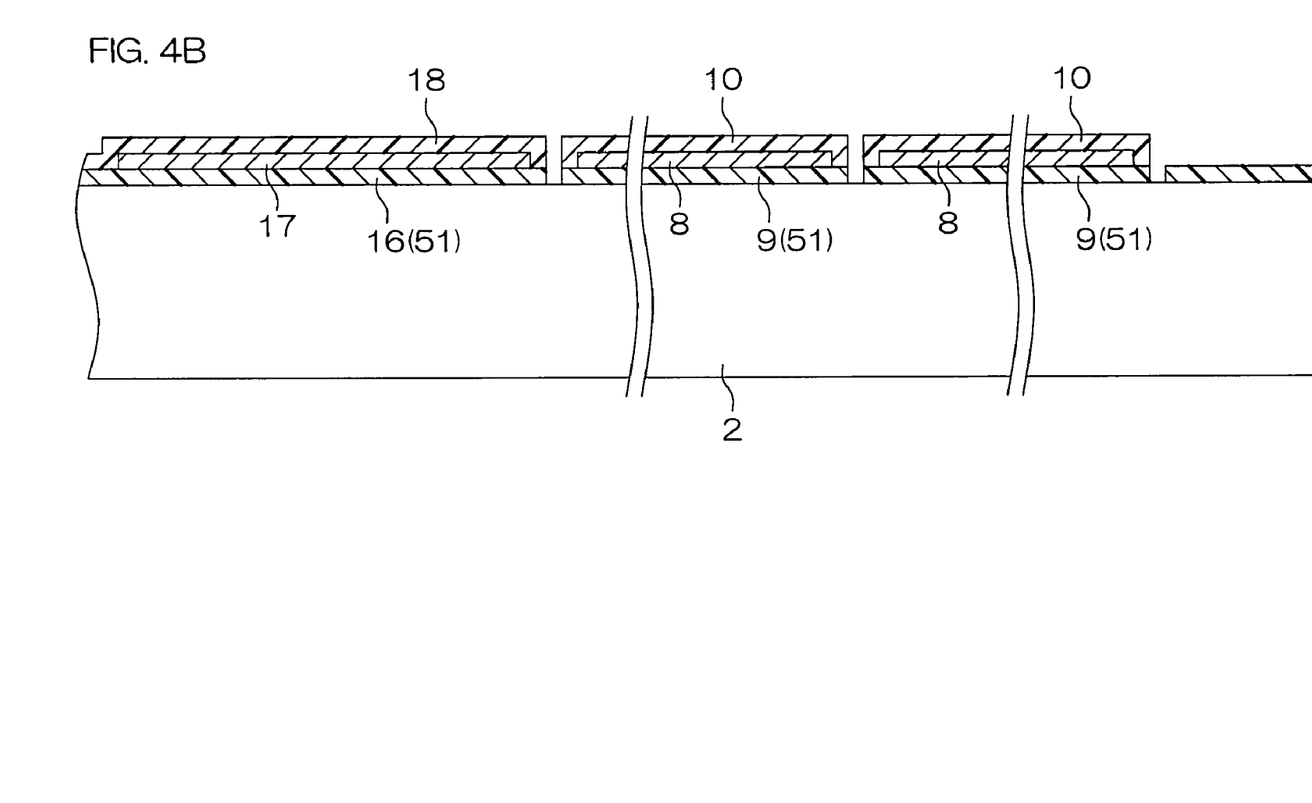
FIG. 4B is a schematic sectional view successively showing the step subsequent to the step shown in FIG. 4A.

Then, a second SiN layer is formed on the overall region of the first SiN layer 51 including the lower electrodes 8 and the first wire 17 by P-CVD. Then, the first SiN layer 51 and the second SiN layer are patterned by photolithography and etching, as shown in FIG. 4B. Therefore, the first SiN layer 51 forms the first lower insulating films 9 and the first insulating layer 16, while the second SiN layer forms the four second lower insulating films 10 and the second insulating layer 18. Thus, the four lower thin films 6 each having the structure formed by holding the lower electrode 8 between the first and second lower insulating films 9 and 10 are obtained. At this point of time, the second insulating layer 18 is not yet provided with the opening for partially exposing each first wire 17.

Figure 4C:
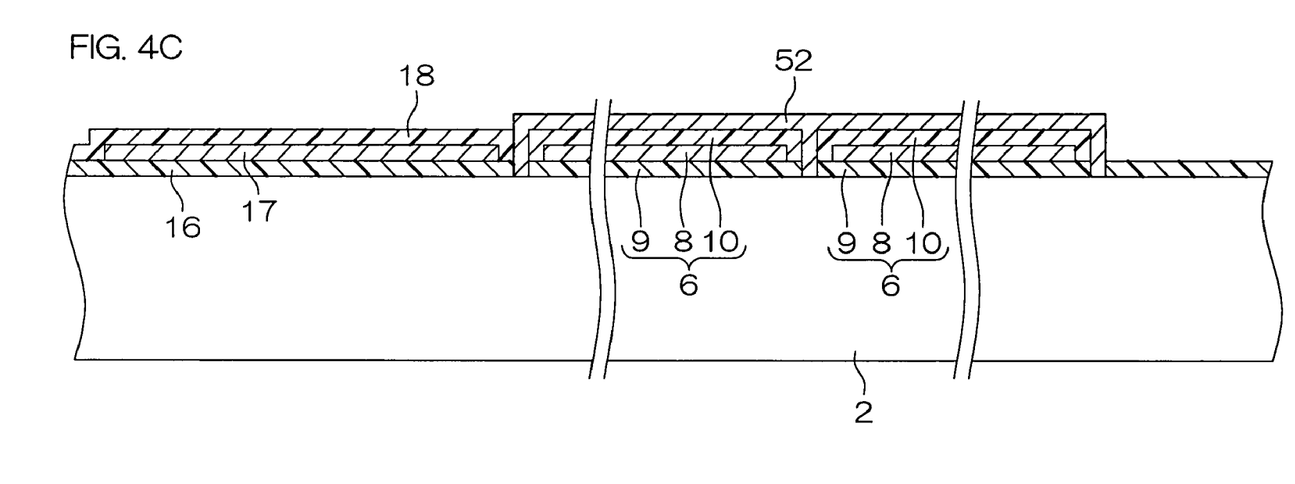
FIG. 4C is a schematic sectional view successively showing the step subsequent to the step shown in FIG. 4A.

Then, SiO$_2$ (silicon oxide) is deposited on the overall region of the semiconductor substrate 2 (including the second lower insulating films 10 and the second insulating layer 18) by P-CVD, and thereafter removed from the second insulating layer 18 by photolithography and etching. Thus, a first sacrificial layer 52 made of SiO$_2$ is formed on the second lower insulating films 10 and portions of the semiconductor substrate 2 exposed through the spaces between the second lower insulating films 10 and the second insulating layer 18, as shown in FIG. 4C.

Figure 4D:
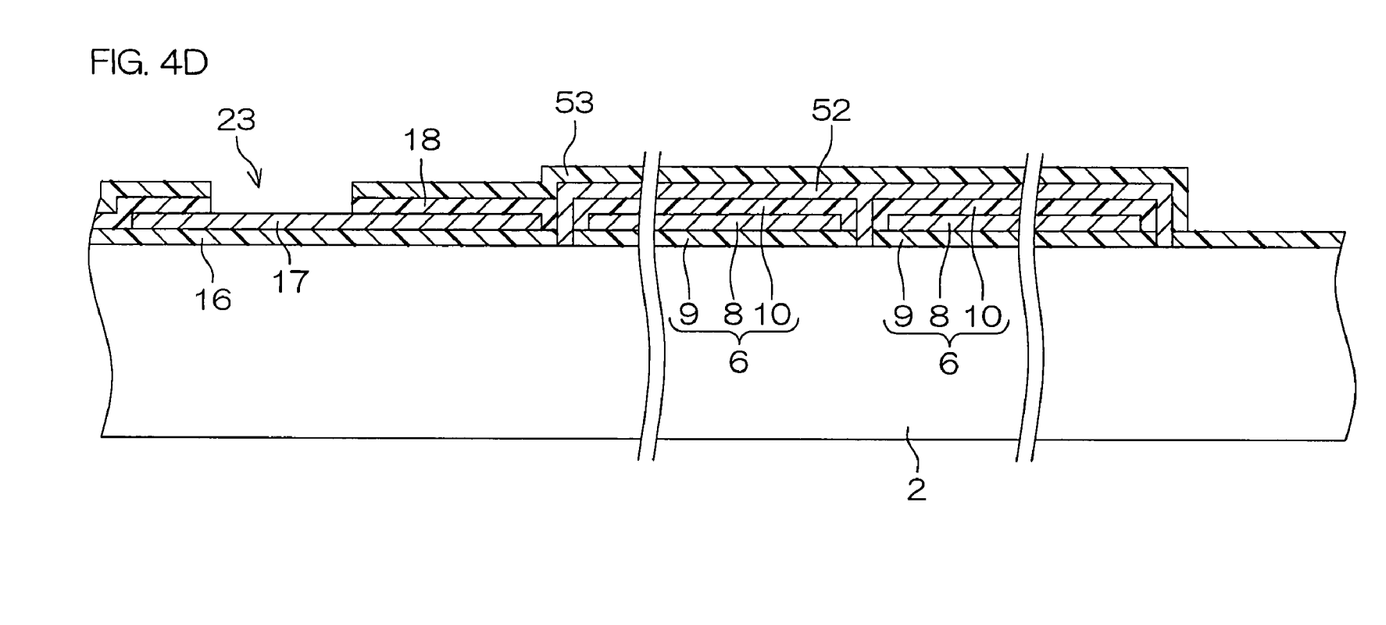
FIG. 4D is a schematic sectional view successively showing the step subsequent to the step shown in FIG. 4A.

After the formation of the first sacrificial layer 52, SiN is deposited on the overall region of the semiconductor substrate 2 by P-CVD, and the deposition layer of SiN is patterned by photolithography and etching. Thus, a third SiN layer 53 is formed, as shown in FIG. 4D. When the deposition layer of SiN is etched, the second insulating layer 18 is so partially etched that the opening 23 is formed in the second insulating layer 18 and the third SiN layer 53, to continuously pass through these layers 18 and 53 in the thickness direction.

Figure 4E:
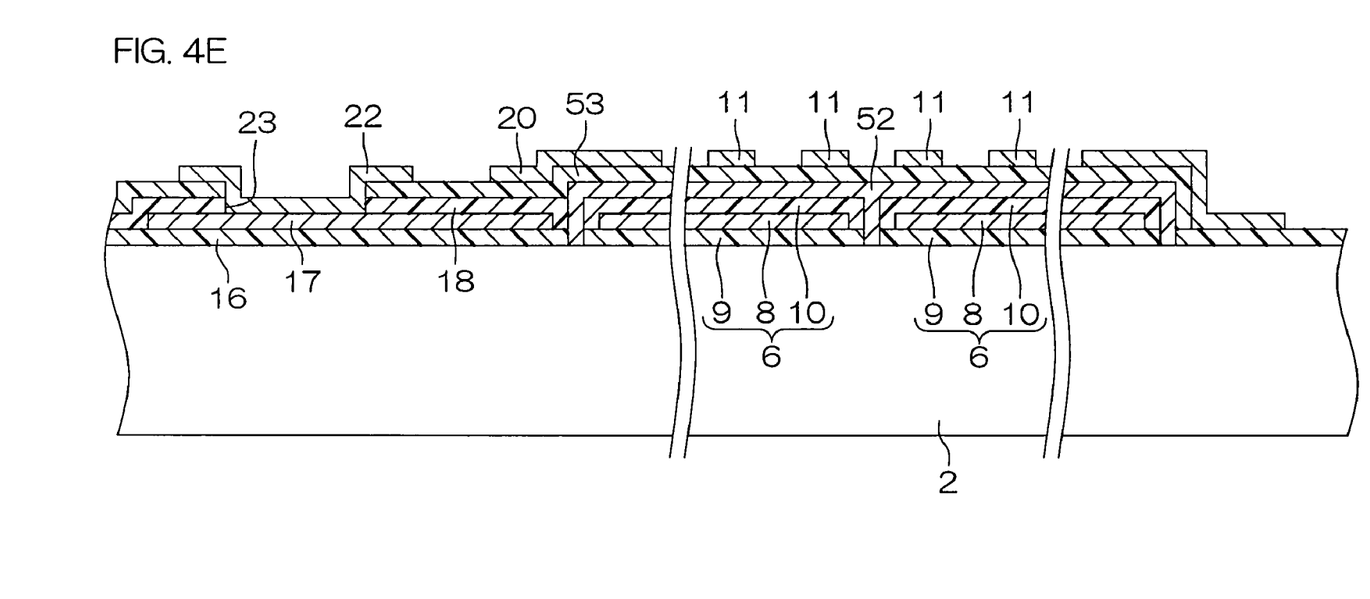
FIG. 4E is a schematic sectional view successively showing the step subsequent to the step shown in FIG. 4A.

Then, an Al film is formed on the overall region of the semiconductor substrate 2 by sputtering. Then, this Al film is patterned by photolithography and etching. Thus, the upper electrodes 11, the second wire 20 and each pad 22 are formed on the third SiN layer 53, as shown in FIG. 4E.

Figure 4F:
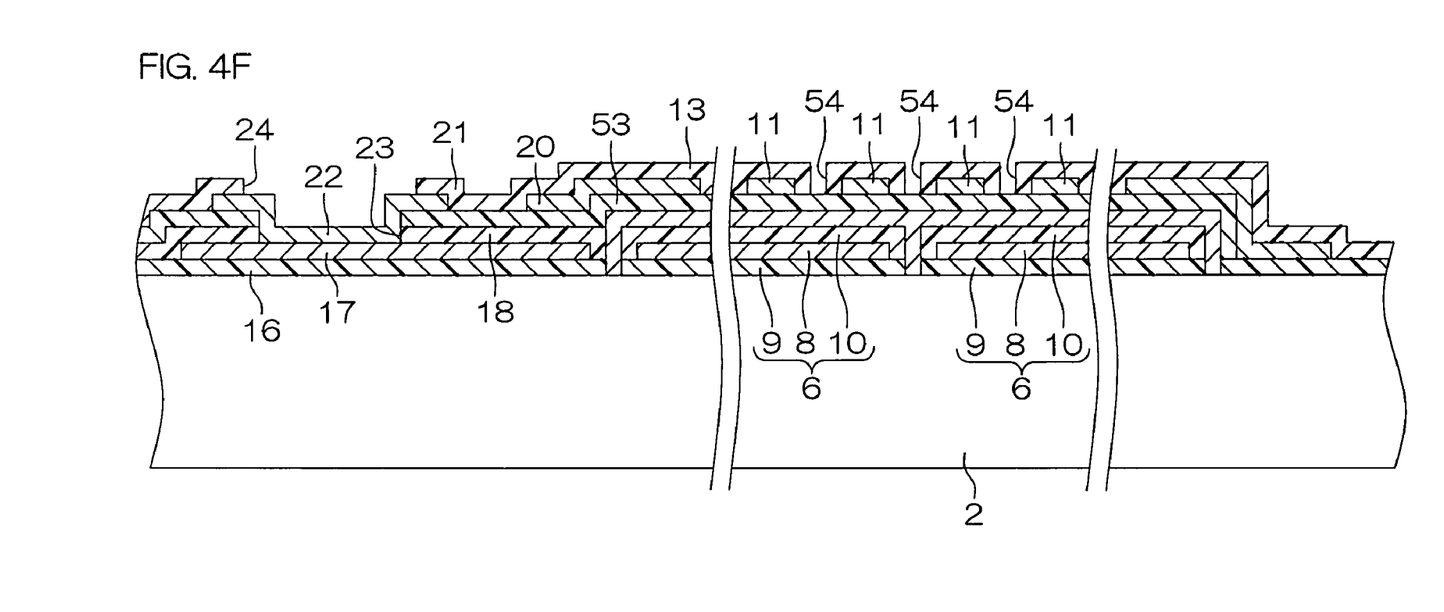
FIG. 4F is a schematic sectional view successively showing the step subsequent to the step shown in FIG. 4A.

Thereafter, a fourth SiN layer is formed on the overall region of the semiconductor substrate 2 by P-CVD. Then, the openings 24 and grooves 54 along the upper electrodes 11 are formed in the fourth SiN layer by photolithography and etching, as shown in FIG. 4F. Thus, the fourth SiN layer forms the four second upper insulating films 13 and the fourth insulating layer 21. The third SiN layer 53 is etched through the grooves 54, whereby grooves continuous to the grooves 54 are formed in the third SiN layer 53, as shown in FIG. 1. Thus, the third SiN layer 53 forms the four first upper insulating films 12 and the third insulating layer 19, and the vibrators 7A and 7B are obtained in the structure formed by holding the upper electrodes 11 between the first and second upper insulating films 12 and 13 respectively.

Further, an etching solution (hydrofluoric acid, for example) is supplied from the spaces between the vibrators 7A and 7B, thereby etching the first sacrificial layer 52. Thus, a cavity is formed between the lower thin films 6 and the vibrators 7A and 7B so that the vibrators 7A and 7B are vibratory in the direction opposed to the lower thin films 6, and the semiconductor substrate 1 is obtained.

Figure 5:
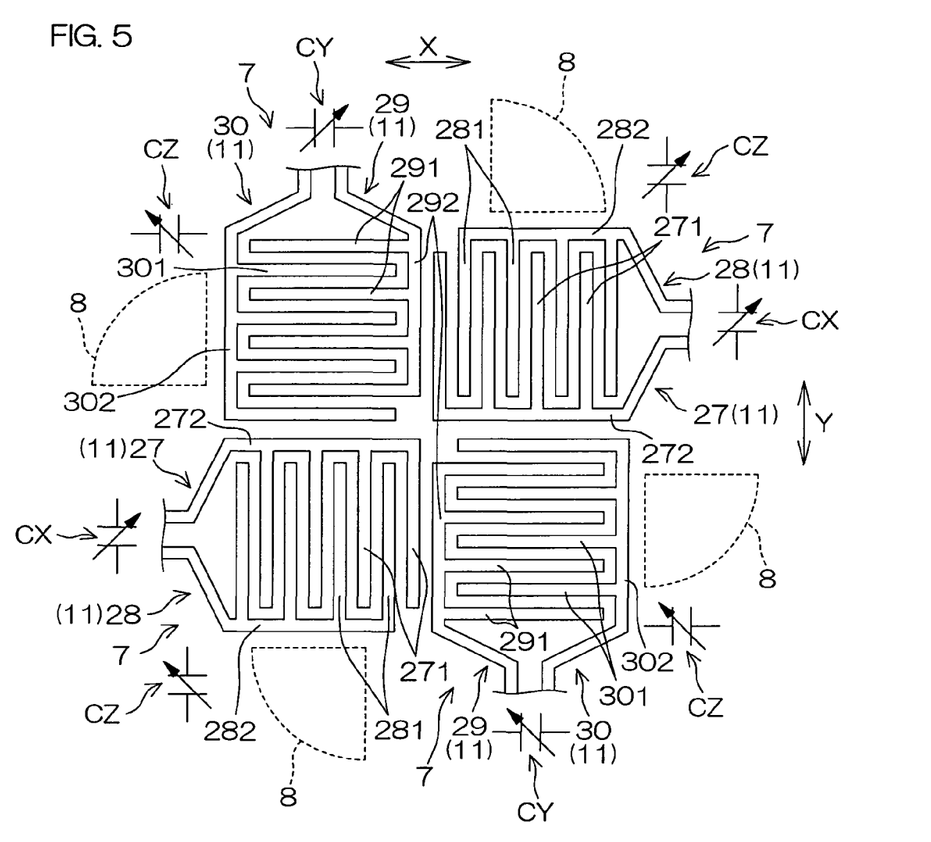
FIG. 5 is a schematic plan view showing another structure (different from the structure shown in FIG. 2) of the upper electrodes.

FIG. 5 is a schematic plan view showing another structure of the upper electrodes.

In the structure shown in FIG. 2, the two X-directional pairs 7 are aligned in the direction X. The two Y-directional pairs 7 are also aligned in the direction X. The X-directional pairs 7 and the Y-directional pairs 7 are aligned in the direction Y.

In the structure shown in FIG. 5, on the other hand, two X-directional pairs 7 and two Y-directional pairs 7 are so arranged that the two X-directional pairs 7 are not aligned in the direction X and the two Y-directional pairs 7 are not aligned in the direction X either, but the X-directional pairs 7 and the Y-directional pairs 7 are aligned in the direction Y. Referring to each X-directional pair 7, the Y-directional pairs 7 are arranged one by one on both sides of the X-directional pair 7 in the directions X and Y. Referring to each Y-directional pair 7, on the other hand, the X-directional pairs 7 are arranged one by one on both sides of the Y-directional pair 7 in the directions X and Y.

Also according to the structure shown in FIG. 5, effects similar to those of the structure shown in FIG. 2 can be attained.

While the embodiment of the present invention has been described, the present invention can be carried out also in other modes. For example, while the vibrators 7A and 7B are supported in a vibratory manner, only the vibrator 7B including the second X-directional electrode 28 or the second Y-directional electrode 30 subjected to application of the prescribed voltage may be supported in a vibratory manner, and the vibrator 7A may be fixed.

The number of the vibrator pairs 7 is not particularly restricted but may be two or not less than three, so far as the sensor portion 3 includes one vibrator pair 7 consisting of the vibrator 7A including the first X-directional electrode 27 and the vibrator 7B including the second X-directional electrode 28 and one vibrator pair 7 consisting of the vibrator 7B including the first Y-directional electrode 29 and the vibrator 7B including the second Y-directional electrode 30 respectively.

While the lower electrodes 8 may be provided in the same number as the vibrator pairs 7 to be opposed to the vibrator pairs 7 respectively as in the aforementioned embodiment, one lower electrode 8 may alternatively be collectively opposed to all vibrator pairs 7, for example. Further alternatively, one lower electrode 8 may be provided every prescribed number of vibrator pairs 7 to be collectively opposed to these vibrator pairs 7.

While the Z-directional acceleration/pressure detector 33 detects the acceleration in the direction Z caused in the semiconductor device 1 or the externally input pressure on the basis of the sum of the changes in the capacitances of the four Z-directional capacitors CZ in the aforementioned embodiment, at least one Z-directional capacitor CZ may alternatively be selected so that the Z-directional acceleration/pressure detector 33 detects the acceleration in the direction Z or the externally input pressure on the basis of the change in the capacitance of the selected Z-directional capacitor CZ.

While the first lower insulating films 9, the second lower insulating films 10, the first upper insulating film 12, the second upper insulating film 13, the first insulating layer 16, the second insulating layer 18, the third insulating layer 19 and the fourth insulating layer 21 are made of SiN, the material therefor may be replaced with $SiO_2$ or a Low-k film material having a lower dielectric constant than $SiO_2$, so far as the same is an insulating material.

While the first sacrificial layer 52 is made of $SiO_2$, the material for the first sacrificial layer 52 is not restricted to $SiO_2$, but another material may be employed so far as the same has an etching selection ratio with the material for the first lower insulating films 9, the second lower insulating films 10, the first upper insulating film 12, the second upper insulating film 13, the first insulating layer 16, the second insulating layer 18, the third insulating layer 19 and the fourth insulating layer 21. If the first lower insulating films 9, the second lower insulating films 10, the first upper insulating film 12, the second upper insulating film 13, the first insulating layer 16, the second insulating layer 18, the third insulating layer 19 and the fourth insulating layer 21 are made of $SiO_2$, for example, SiN may be employed as the material for the first sacrificial layer 52.

Further, the material for the lower electrodes 8 and the upper electrodes 11 is not restricted to Al, but another metal such as Au may alternatively be employed.

The four lower thin films 6 may be provided in a vibratory manner with an interval from the surface of the semiconductor substrate 2.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-281969 filed with the Japan Patent Office on Oct. 30, 2007, and Japanese Patent Application No. 2008-241094 filed therewith on Sep. 19, 2008, the disclosures of these applications are incorporated herein by reference.

What is claimed is:

1. A semiconductor device including:
   a semiconductor substrate; and
   an MEMS sensor provided on the semiconductor substrate, wherein
   the MEMS sensor comprises:
   a first electrode having a plurality of first interdigital portions aligned in a prescribed direction X at an interval;
   a second electrode, having a plurality of second interdigital portions aligned in the direction X at an interval, so arranged that the second interdigital portions are opposed to the first interdigital portions in the direction X respectively;
   a third electrode having a plurality of third interdigital portions aligned in a direction Y orthogonal to the direction X at an interval;
   a fourth electrode, having a plurality of fourth interdigital portions aligned in the direction Y at an interval, so arranged that the fourth interdigital portions are opposed to the third interdigital portions in the direction Y respectively;
   a fifth electrode opposed to the first electrode, the second electrode, the third electrode and the fourth electrode in a direction Z orthogonal to the direction X and the direction Y;
   an X-directional capacitor being formed from each first interdigital portion and each respective second interdigital portion opposed thereto in the direction X;
   a Y-directional capacitor being formed from each third interdigital portion and each respective fourth interdigital portion opposed thereto in the direction Y; and
   a Z-directional capacitor being formed from each of vibratory ones of the first to fourth electrodes, and the fifth electrode, the fifth electrode being opposed to the first to fourth electrodes in the direction Z.

2. The semiconductor device according to claim 1, further including an X-directional acceleration detector for detecting X-directional acceleration acting on the MEMS sensor on the basis of a change in the capacitance of the X-directional capacitor.

3. The semiconductor device according to claim 1, further including a Y-directional acceleration detector for detecting Y-directional acceleration acting on the MEMS sensor on the basis of a change in the capacitance of the Y-directional capacitor.

4. The semiconductor device according to claim 2, further including a Y-directional acceleration detector for detecting Y-directional acceleration acting on the MEMS sensor on the basis of a change in the capacitance of the Y-directional capacitor.

5. The semiconductor device according to claim 1, further including a Z-directional acceleration detector for detecting Z-directional acceleration acting on the MEMS sensor on the basis of a change in the capacitance of the Z-directional capacitor.

6. The semiconductor device according to claim 4, further including a Z-directional acceleration detector for detecting Z-directional acceleration acting on the MEMS sensor on the basis of a change in the capacitance of the Z-directional capacitor.

7. The semiconductor device according to claim 1, wherein
   the first electrode and the second electrode constitute an X-directional pair for detecting X-directional acceleration,
   the third electrode and the fourth electrode constitute a Y-directional pair for detecting Y-directional acceleration,
   the MEMS sensor includes a plurality of X-directional pairs and a plurality of Y-directional pairs, and
   the X-directional pairs and the Y-directional pairs are so arranged that the X-directional pairs are aligned in the direction X, the Y-directional pairs are aligned in the direction X, and the X-directional pairs and the Y-directional pairs are aligned in the direction Y.

8. The semiconductor device according to claim 1, wherein
   the first electrode and the second electrode constitute an X-directional pair for detecting X-directional acceleration,
   the third electrode and the fourth electrode constitute a Y-directional pair for detecting Y-directional acceleration,
   the MEMS sensor includes a plurality of X-directional pairs and a plurality of Y-directional pairs, and
   the X-directional pairs and the Y-directional pairs are so arranged that the X-directional pairs are not aligned in the direction X and the Y-directional pairs are not aligned in the direction X, but the X-directional pairs and the Y-directional pairs are aligned in the direction Y.

* * * * *